(12) United States Patent
Naganawa et al.

(10) Patent No.: US 9,336,991 B2
(45) Date of Patent: *May 10, 2016

(54) ION IMPLANTATION DEVICE

(71) Applicant: LINTEC Corporation, Tokyo (JP)

(72) Inventors: Satoshi Naganawa, Tokyo (JP);
Daisuke Goto, Tokyo (JP); Suguru Kenmochi, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/420,377

(22) PCT Filed: Sep. 12, 2013

(86) PCT No.: PCT/JP2013/074675
§ 371 (c)(1),
(2) Date: Feb. 9, 2015

(87) PCT Pub. No.: WO2014/046003
PCT Pub. Date: Mar. 27, 2014

(65) Prior Publication Data
US 2015/0206710 A1    Jul. 23, 2015

(30) Foreign Application Priority Data

Sep. 18, 2012  (JP) .................. 2012-204942

(51) Int. Cl.
*H01J 37/30*  (2006.01)
*H01J 37/317*  (2006.01)
(Continued)

(52) U.S. Cl.
CPC ............. *H01J 37/3171* (2013.01); *C23C 14/48* (2013.01); *C23C 14/562* (2013.01); *H01J 37/32* (2013.01); *H01J 37/3277* (2013.01); *H01J 37/32412* (2013.01); *H05H 1/46* (2013.01); *H01J 2237/006* (2013.01); *H01J 2237/18* (2013.01);
(Continued)

(58) Field of Classification Search
USPC .................. 250/492.1, 492.2, 492.22, 492.21, 250/492.23, 492.3
See application file for complete search history.

(56) References Cited

U.S. PATENT DOCUMENTS

| | | | | |
|---|---|---|---|---|
| 6,096,389 A | * | 8/2000 | Kanai | ............................. 427/575 |
| 2011/0189450 A1 | * | 8/2011 | Hoshi | ....................... B05D 3/00 428/215 |
| 2015/0206700 A1 | * | 7/2015 | Naganawa et al. | ......... 250/492.1 |

FOREIGN PATENT DOCUMENTS

| | | |
|---|---|---|
| JP | 05-251391 | 9/1993 |
| JP | 2005-071661 | 3/2005 |

(Continued)

OTHER PUBLICATIONS

International Search Report PCT/JP2013/074675 dated Nov. 5, 2013.
Chinese Office Action dated Dec. 1, 2015.

*Primary Examiner* — Nicole Ippolito
(74) *Attorney, Agent, or Firm* — Young & Thompson

(57) ABSTRACT

The disclosed ion implantation apparatus has a vacuum chamber 11, a roller electrode 13 having a portion of an outer circumferential part on which a film 3 is wound, voltage application unit 23 for applying a voltage to the roller electrode, and a gas introduction unit having a gas supply outlet for supplying an ion implantation gas into the vacuum chamber, wherein the gas introduction unit and a gas discharge outlet are disposed so as to be opposite each other along the axial direction of the roller electrode, the roller electrode intervening therebetween.

9 Claims, 7 Drawing Sheets

(51) Int. Cl.
  *C23C 14/48* (2006.01)
  *H05H 1/46* (2006.01)
  *H01J 37/32* (2006.01)
  *C23C 14/56* (2006.01)
  *H05H 1/48* (2006.01)

(52) U.S. Cl.
  CPC . *H01J 2237/31701* (2013.01); *H05H 2001/485* (2013.01)

(56) References Cited

FOREIGN PATENT DOCUMENTS

| JP | 2006-070238 | 3/2006 |
| WO | 03104525 | 12/2003 |
| WO | 2010107018 | 9/2010 |

\* cited by examiner (1)

(2)

ION IMPLANTATION DEVICE

TECHNICAL FIELD

The present invention relates to an ion implantation apparatus.

BACKGROUND ART

Conventionally, a long continuous film is surface-modified through ion implantation. In one mode of the technique, while the film is conveyed toward one direction ions in a plasma are implanted into the target surface of the film, to thereby form a gas barrier layer on, for example, the surface of the film (see, for example, Patent Document 1).

Patent Document 1 discloses an ion implantation apparatus for carrying out ion implantation. The ion implantation apparatus disclosed in Patent Document 1 includes, in the vacuum chamber thereof, rollers such as an unwind roller, a wind-up roller, and a roller electrode, and gas introduction means. The roller electrode is connected to voltage application means.

In the above ion implantation apparatus, an ion implantation gas is fed to the chamber. When a voltage is applied to the roller electrode by the voltage application means, an electric field is provided between the roller electrode and the chamber wall serving as a ground, to thereby form a plasma. Through application of negative DC high-voltage pulse, ions generated by the plasma are drawn to the roller electrode, whereby the ions are implanted into the surface of the film wound on the roller electrode.

PRIOR ART DOCUMENTS

Patent Documents

Patent Document 1: Japanese Patent Application Laid-open (kokai) No. 2006-70238

SUMMARY OF THE INVENTION

Problems to be Solved by the Invention

In recent years, the film to foe treated has become wider and wider, and the size of the roller electrode has increased, resulting in up-scaling of the ion implantation apparatus. When such a large-scale ion implantation apparatus is employed, the ion implantation gas is retained in the ion Implantation apparatus. In this case, high-gas-concentration portions and low-gas-concentration portions exist in a single chamber, thereby possibly failing to maintain the uniformity in plasma density in. the vacuum chamber, and to uniformly perform surface modification, which is problematic.

Thus, an object of the present invention, for overcoming the drawback involved in the aforementioned conventional technique, is to provide an ion implantation apparatus which attains enhanced uniformity in plasma density.

Means for Solving the Problems

The ion implantation apparatus of the present invention comprises:
a vacuum chamber,
a roller electrode having a portion of an outer circumferential part on which a film is wound,
voltage application means for applying a voltage to the roller electrode,
a gas introduction unit having a gas supply outlet for supplying an ion implantation gas into the vacuum chamber, and
a gas discharge outlet for discharging the gas present in the gas introduction unit and in the vacuum chamber,
wherein the gas introduction unit and the gas discharge outlet are disposed so as to be opposite each other along the axial direction of the roller electrode, the roller electrode intervening therebetween.

According to the present invention, the gas introduction unit and the gas discharge outlet are disposed so as to be opposite each other along the axial direction of the roller electrode, the roller electrode intervening therebetween, whereby the gas flows along the axial direction of the roller electrode. Thus, the gas readily flows during ion implantation treatment and is difficult to retain in the vacuum chamber. As a result, a uniform gas concentration is attained, to thereby attain a uniform plasma density.

The gas introduction unit is preferably provided wish a plurality of gas supply outlets. Through provision of the plurality of gas supply outlets, gas is uniformly supplied into the vacuum chamber, to thereby attain higher uniformity in plasma density.

Preferably, the gas supply outlets are disposed so as to be separated from one another and be opposite a peripheral portion of an axial end of the roller electrode. Through provision of the gas supply outlets in such a manner, a gas flow is formed around the roller electrode; i.e., a region where an electric field is provided, whereby plasma density can be enhanced.

In another preferred mode, a flow straightening member is disposed between the roller electrode and the inner wall of the vacuum chamber, along the direction of gas flow from the gas supply outlets to the gas discharge outlet. Through provision of the flow straightening member, the gas flow is straightened to thereby prevent retention of gas in the vacuum chamber, and facilitate diffusion of the gas to a site where no electric field is provided. As a result, a uniform gas concentration is attained, to thereby attain a uniform plasma density.

The flow straightening member is preferably formed of a conductive metal.

EFFECTS OF THE INVENTION

The ion implantation apparatus of the present invention is advantageous and can enhance uniformity in plasma density.

MODES FOR CARRYING OUT THE INVENTION

Embodiment 1

Embodiments of the present invention will next be described, with reference to FIGS. 1 to 4.

Figure 1:
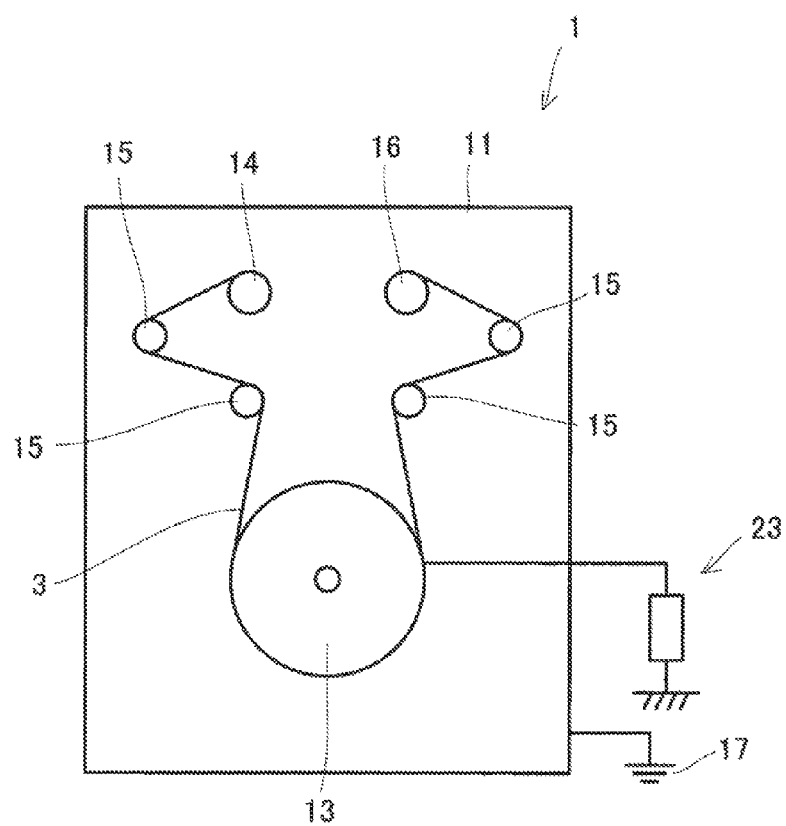
FIG. 1 A schematic view of an ion implantation apparatus according to Embodiment 1.

As shown in FIG. 1, an ion implantation apparatus 1 has a vacuum chamber 11.

The vacuum chamber 11 is also provided with a roller electrode 13, an unwind roller 14, a plurality of conveying rollers 15, and a wind-up roller 16. On the bottom portion of the roller electrode 13, a film 3 which has been, unwound by means of the unwind roller 14 and conveyed via one of the conveying rollers 15 is wound. The film 3 on the surface of the roller electrode 13 undergoes ion implantation treatment, details of which will be described hereinbelow, and is conveyed to a wind-up roller 16 via another one of the conveying rollers 15. In other words, the film present at the unwind roller 14 is not subjected to ion implantation treatment, and that present at the wind-up roller 16 has already been subjected to ion implantation treatment.

The roller electrode 13 is formed of a conductor. The roller electrode 13 is connected to voltage application means 23. The voltage application means 23 is configured to apply AC voltage or DC voltage to the roller electrode 13. Although not illustrated in FIG. 1, the voltage application means 23 is configured to apply voltage to an axial end of the roller electrode so as to cause current to flow in the axial direction (width direction) of the roller electrode. Through application of voltage by the voltage application means 23, the roller electrode 13 works as an electrode.

Figure 2:
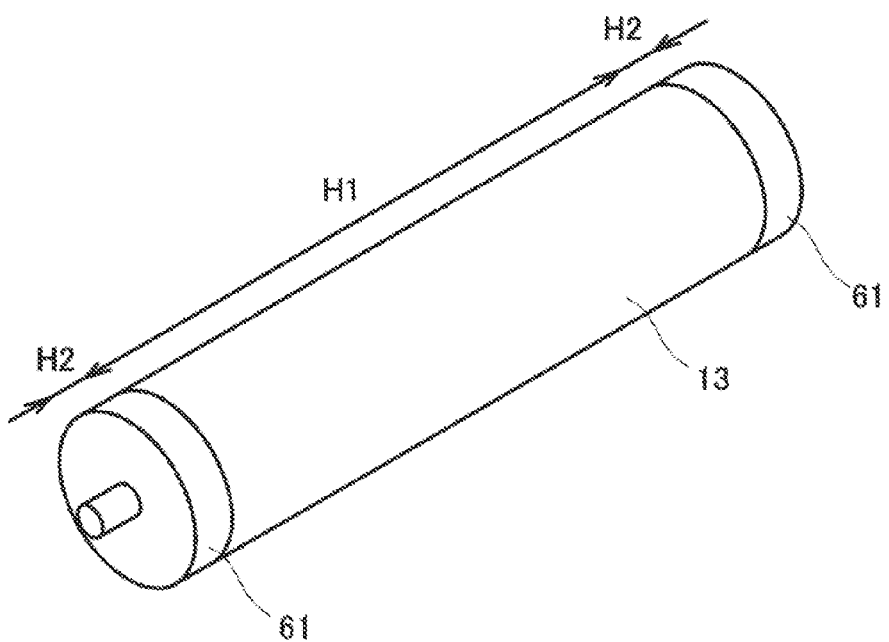
FIG. 2 A schematic perspective view of extension members.

As shown in FIG. 2, an extension member 61 may be appended to each end of the same roller electrode 13 as employed in Embodiment 1 in order to elongate the roller electrode 13 in the axial direction. The extension member 61 has the same diameter as that of the roller electrode 13 and is joined to each end of the roller electrode 13. As a result, the original length H1 of the roller electrode 13 in the axial direction increases by 2×H2 (H2: length of the extension member 61).

Through provision of the extension member 61, a drop in plasma density, which would otherwise be caused by streams of the plasma around an end of the roller electrode 13, can be prevented, whereby uniform ion implantation can be realized in the width direction of the film.

Figure 3:
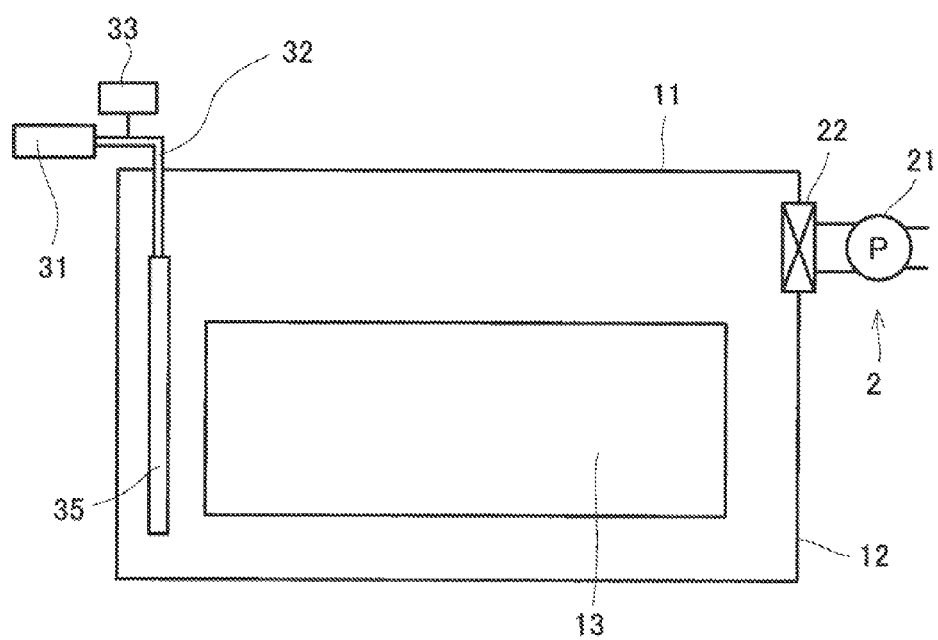
FIG. 3 A schematic view of an ion implantation apparatus according to Embodiment 1.

As shown in FIG. 3, the vacuum chamber 11 is provided with a gas introduction unit 35 having a gas supply outlet 36 (see FIG. 4) for supplying an ion implantation gas into the vacuum chamber 11, and a gas discharge outlet 22 for discharging the gas in the vacuum chamber 11. The gas introduction unit 35 is disposed between the roller electrode 13 and the inner wall of the vacuum chamber 11, along the axial direction of the roller electrode 13.

To the gas introduction unit 35, a gas source 31, a gas pipe 32 connected to the gas source 31, and control means 33 for controlling the flow rate in the gas pipe 32 are connected. The gas source 31 reserves therein an ion implantation gas. In supplying the ion implantation gas into the vacuum chamber 11, the flow rate of the gas fed from the gas source 31 and passes through the gas pipe 32 is controlled by the control means 33. In this state, the ion implantation gas is supplied into the vacuum chamber 11 through the gas introduction unit 35.

To the gas discharge outlet 22, a vacuum pump 21 is connected, to thereby discharge the gas in the vacuum chamber 11 and control the vacuum degree of the vacuum chamber 11 to a specific value. The gas discharge outlet 22 is disposed at the side wall 12 of the vacuum chamber 11 such that the gas discharge outlet 22 oppositely faces the gas introduction unit 35 along the axial direction of the roller electrode 13, with the roller electrode 13 intervening therebetween.

Figure 4:
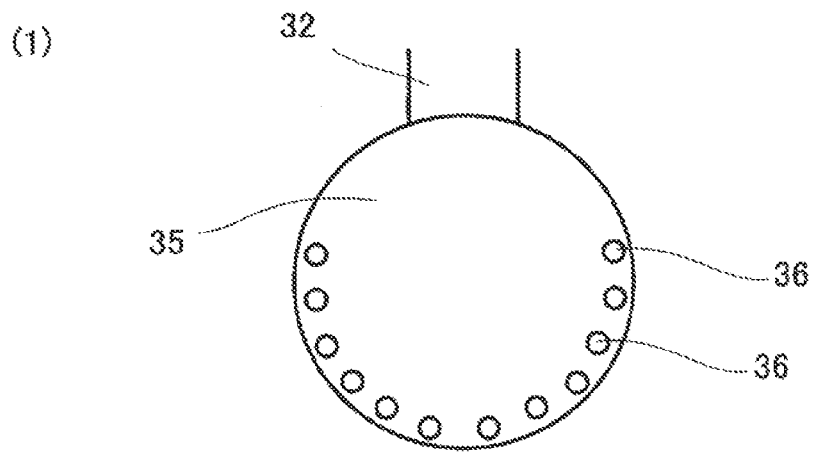
FIG. 4 A schematic view of a gas introduction unit of the ion implantation apparatus according to Embodiment 1.
Figure 4:
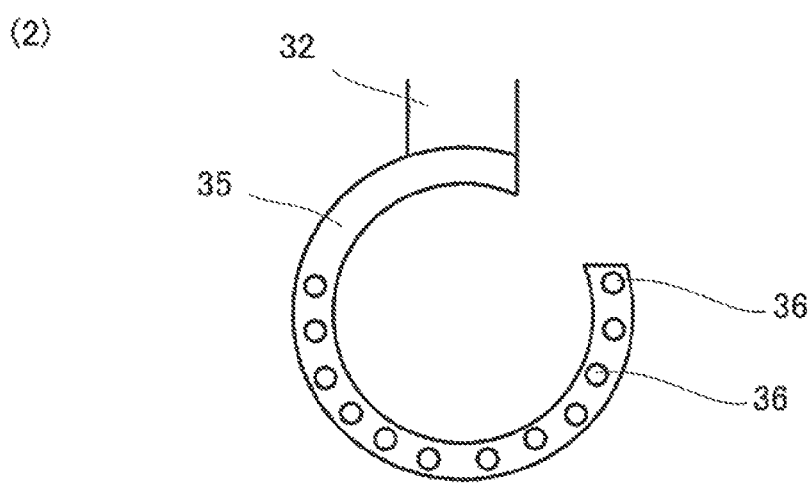

As shown in FIG. 4(1), in Embodiment 1, the gas introduction unit 35 assumes a disk-like shape and is provided with a plurality of gas supply outlets 36. The gas supply outlets 36 are disposed so as to be separated from one another and be opposite a peripheral portion of an axial end of the roller electrode 13. Also, the gas supply outlets 36 are arranged so that they face the lower peripheral portion of an axial end of the roller electrode 13 which portion comes into contact with the film 3.

No particular limitation is imposed on the shape or the like of the gas introduction unit 35, and any shape may be employed, so long as the gas supply outlets 36 face the lower peripheral portion of an axial end of the roller electrode 13. For example, as shown in FIG. 4(1), the gas introduction unit 35 may have a circular cross-section similar to the generally circular cross-section of the roller electrode 13. Alternatively, as shown in FIG. 4(2), the gas introduction unit 35 may be curved along the circumferential direction of the roller electrode 13. In Embodiment 1, a plurality of gas supply outlets 36 are provided. However, a single gas supply outlet 36 may be employed, so long as the ion implantation gas can be uniformly supplied into the vacuum chamber.

Next will be described the ion. implantation treatment performed by means of the ion implantation apparatus 1.

Ion implantation treatment is defined as the process which includes implanting ions in a plasma into the surface of an object to thereby modify the surface, whereby an ion-implanted layer is formed.

Firstly, the film 3, an object to be treated, will be described. The film 3, which is a work of the treatment in Embodiment 1, is a polymer film. No particular limitation is imposed on the polymer film, and examples of the polymer include polyimide, polyamide, polyamide-imide, polyphenylene ether, polyether-ketone, polyether-ether-ketone, polyolefin, polyester, polycarbonate, polysulfone, polyether-sulfone, polyphenylene sulfide, polyarylate, acrylic resin, cycloolefin polymer, and aromatic polymer. Of these, polyester, polyamide, and cycloolefin polymer are preferred, with polyester and cycloolefin polymer being particularly preferred, since these polymer are often employed for forming a polymer film having a gas barrier property or the like and can provide an ion-implanted layer having a gas barrier property or the like. Examples of the polyester include polyethylene terephthalate, polybutylene terephthalate, polyethylene naphthalate, and polyarylate. In the present invention, the film 3 (i.e., a treatment work) is not limited to the aforementioned polymer films. The film 3 may be a laminate film formed of a polymer film and, stacked thereon, a layer containing a material which exhibits a gas barrier property through ion implantation (e.g., a silicon-containing polymer such as polysilazane or polyorganosiloxane).

No particular limitation is imposed on the thickness of the film 3. From the viewpoints of ease of winding and application of the film, the thickness is generally 1 to 1,000 μ, preferably 5 to 500 μm, more preferably 10 to 200 μm.

In a specific procedure, the ion implantation apparatus is activated. The inside pressure of the vacuum chamber 11 is adjusted to $5.0 \times 10^{-3}$ Pa or lower.

After the inside pressure of the vacuum chamber 11 has been adjusted to a constant value falling within the aforementioned range, an ion implantation gas is supplied to the vacuum chamber 11 through the gas introduction unit 35.

Examples of the ion implantation gas to be supplied include non-metallic gases such as water, hydrogen, nitrogen, and oxygen; rare gases such as argon, helium, and fluorocarbon; and ions of conductive metals such as gold, silver, copper, platinum, nickel, and aluminum. Of these, rare gases and non-metallic gases are preferred, since they can be ion-implanted in a simpler manner, to thereby efficiently produce a film having a favorable gas barrier property or the like. Among these preferred species, nitrogen, oxygen, argon, and helium are more preferred, with argon being particularly preferred, since they can be appropriately and conveniently selected in response to the purpose of surface treatment.

The flow rate of supplied gas is 10 to 2,000 sccm, preferably 100 to 1,000 sccm. When the flow rate satisfies the conditions, a plasma of interest can be formed. The inside pressure of the vacuum chamber 11 upon supply of the ion implantation gas is about $1.0 \times 10^{-4}$ to about 1.0 Pa, preferably about $1.0 \times 10^{-2}$ to about $1.0 \times 10^{-1}$ Pa.

Under these conditions, the film 3 is conveyed via the unwind roller 14, the conveying roller 15, and the roller electrode 13, to the wind-up roller 16. No particular limitation is imposed on the speed of winding the film 3, and the winding speed is generally 0.5 to 20 m/min.

Then, an AC voltage is applied to the roller electrode 13 by the voltage application means 23, whereby a plasma is generated. No particular limitation is imposed on the frequency of the applied AC voltage, and the frequency is generally 500 to 5,000 Hz. No particular limitation is imposed on the applied electric power, and it is generally 500 to 10,000 W. Under these conditions, a plasma can be consistently generated.

Also, a DC voltage is applied to the roller electrode 13 by the voltage application means 23. The DC voltage is, for example, −1 kV to −50 kV, more preferably −3 kV to −30 kV, particularly preferably −5 kV to −20 kV. When the applied DC voltage is higher than −1 kV, ions are not readily drawn, to thereby encounter difficulty in formation of an ion-implanted layer having sufficient gas barrier property or the like, whereas when the DC voltage is lower than −50 kV, an X-ray is generated, which is not preferred in production of the surface modified film.

Through the aforementioned procedure, an electric field is provided between the inner wall of the vacuum chamber 11 and the roller electrode 13, to thereby form a plasma. Positive ions in the thus-formed plasma are drawn to the roller electrode 13 by application of the negative voltage, whereby the ions are implanted into the surface of the film 3 wound on the roller electrode 13. Thus, ions are implanted into the surface of the film 3.

The ion implantation gas passing through the gas pipe 32 via the control means 33 is fed to the gas introduction unit 35, and is uniformly supplied into the vacuum chamber 11 through the plurality of gas supply outlets 36. The thus-supplied gas is discharged through the gas discharge outlet 22.

In Embodiment 1, since the gas supply outlets 36 and the gas discharge outlet 22 are disposed so as to be opposite each other along the axial direction of the roller electrode 13, the roller electrode 13 intervening therebetween, she ion implantation gas supplied through the gas supply outlets 36 directly flows to the gas discharge outlet 22, whereby retention of the ion implantation gas in the vacuum chamber can be prevented. Thus, the gas concentration becomes uniform along the axial direction of the roller electrode 13. As a result, the plasma density of the provided plasma becomes uniform along the axial direction, to thereby form a uniform ion implantation layer of interest.

In Embodiment 1, the gas introduction unit 35 having the gas supply outlets 36 and the gas discharge outlet 22 are disposed so as to be opposite each other along the axial direction of the roller electrode 13, the roller electrode 13 intervening therebetween. Thus, the ion implantation gas supplied through the gas supply outlets 36 flows along the axial direction of the roller electrode 13 and is discharged through the gas discharge outlet 22. As a result, the ion implantation gas uniformly flows along the axial direction of the roller electrode 13, whereby the plasma density during ion implantation becomes uniform.

Embodiment 2

Figure 5:
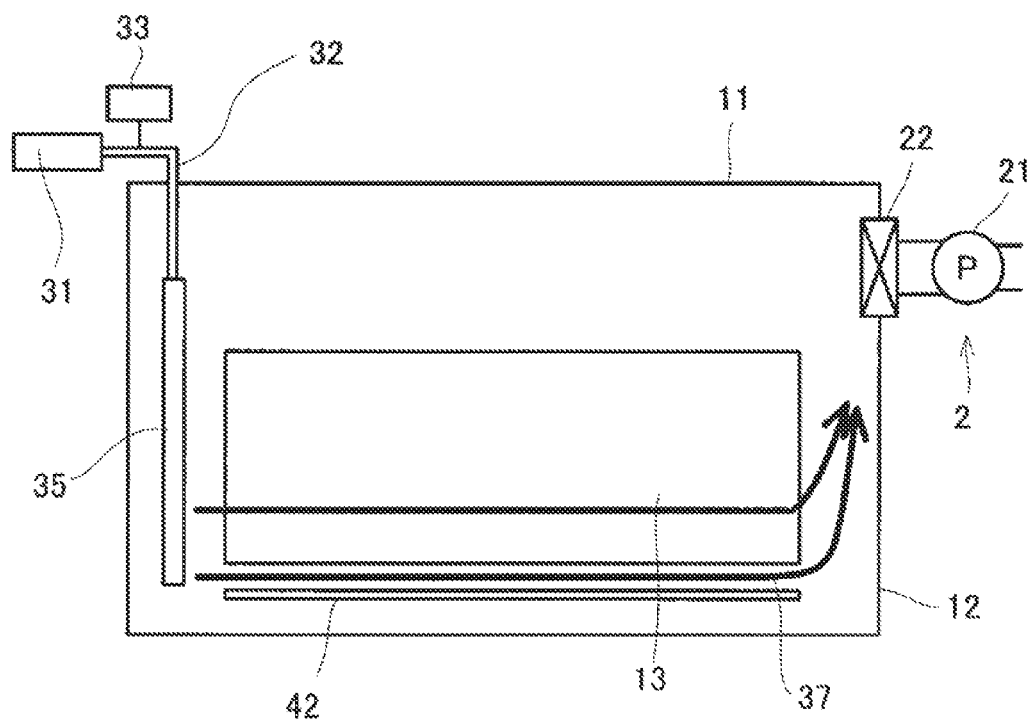
FIG. 5 A schematic view of an ion implantation apparatus according to Embodiment 2.
Figure 6:
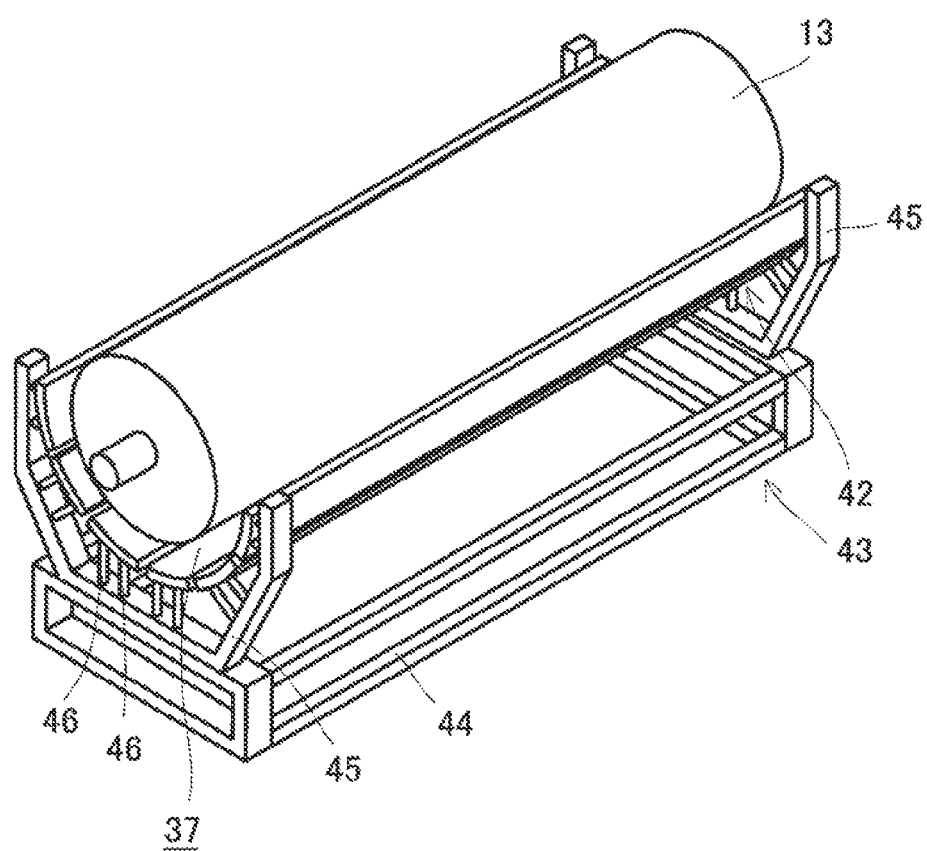
FIG. 6 A schematic perspective view of a flow straightening device employed in the ion implantation apparatus according to Embodiment 2.

As shown in FIGS. 5 and 6, embodiment 2 differs from Embodiment 1 in that a flow straightening member 42 is disposed between the roller electrode 13 and the inner wall of the vacuum chamber 11 in the vacuum chamber 11. Although the details will be described hereinbelow, the flow straightening member 42 straightens the flow of the ion implantation gas in the vacuum chamber. Through provision of the flow straightening member, a plasma with high uniformity can be provided.

With reference to FIGS. 5 and 6, the configuration of the flow straightening member 42 in the vacuum chamber will be described in detail.

The flow straightening member 42 is supported by a support portion 43 and disposed between the roller electrode 13 and the inner wall of the vacuum chamber 11. The flow straightening member 42 is separated from the roller electrode 13 with a constant space 37.

The support portion 43 has a rectangular frame 44. The longitudinal direction of the frame 44 generally coincides with the axial direction of the roller electrode 13. At each longitudinal end of the frame 44, a support base 45 is disposed on the top surface of the frame. Each support base 45 is provided with a plurality of support members 46 separated from one another. The support members 46 are fixed to respective flow straightening members 42 at the ends thereof and support the flow straightening members 42 on each support base 45. No particular limitation is imposed on the shape or the like of the support portion 43, so long as the support portion can sustain and fix the flow straightening members 42.

Each of the flow straightening members 42 is a rectangular plate-like member. The flow straightening members 42 face only the lower peripheral, surface of the roller electrode 13 which surface comes into contact with the film 3 (film wound surface). The space 37 is provided between each flow straightening member 42 and the roller electrode 13. Notably, no particular limitation is imposed on the shape or the like of the flow straightening members 42, so long as the members can straighten the flow of the ion implantation gas in the vacuum chamber 11.

The rectangular-shape flow straightening members 42 are separated from one another and arranged, such that the short sides thereof are aligned, along the circumferential direction of the roller electrode 13. The long sides of the flow straightening members 42 extend along the axial direction of the roller electrode 13. The length of the long side of each flow straightening member 42 generally coincides with the axial length of the roller electrode 13.

In Embodiment 2, six flow straightening members 42 are disposed along the lower portion of the surface of the roller electrode 13 with which surface the film 3 comes into contact. The plurality of flow straightening members 42 are separated from one another.

In Embodiment 2, the plurality of flow straightening members 42 are arranged such that they are separated from one another. However, the configuration mode is not limited thereto, so long as the flow of the ion implantation gas can be straightened in the vacuum chamber 11. For example, a single plate member curved along the circumferential direction and serving as the flow straightening member 42 may be disposed between the roller electrode 13 and the inner wall of the vacuum chamber 11. Alternatively, a plurality of plate-like members which are curved along the circumferential direction may be disposed along the axial direction of the roller electrode 13.

In Embodiment 2, since the flow straightening members 42 are disposed between the roller electrode 13 and the inner wall of the vacuum chamber 11, the ion implantation gas can uniformly flow through the space 37 between the roller electrode 13 and the flow straightening members 42, That is, through provision of the flow straightening members 42, the ion implantation gas does not excessively diffuse in the large scale vacuum chamber 11 and is straightened, whereby the gas can flow through the space 37 between the roller electrode 13 and the flow straightening members 42. As a result, the ion implantation gas concentration along the axial direction of the roller electrode 13 becomes uniform, and higher uniformity in plasma, density along the axial direction can be ensured.

Each flow straightening member 42 may be provided with a hole in order to reduce the weight thereof, without impairing the effect of straightening the flow of the ion implantation gas.

No particular limitation is imposed on the material of the flow straightening members 42, so long as the members can straighten the flow of the ion implantation gas in the vacuum chamber 11. Although details thereof will be described hereinbelow, in the case where the flow straightening member is configured to also serve as an electrode, it is formed of a metal such as iron, aluminum, or an alloy thereof. In Embodiment 2, stainless steel (SUS) is used, from the viewpoints of strength and production cost. In other words, the flow straightening member 42 serve as electrodes.

In this case, the flow straightening members 42 are connected to the vacuum chamber 11 via the support portion 43. That is, the flow straightening members 43 are connected to the ground via the vacuum chamber 11 and the support portion 43.

In the case where the flow straightening members 42 are formed of a material which allows the members to serve as an electrode, an electric field is provided between the roller electrode 13 and each flow straightening member 42 serving as a ground, to thereby generate a plasma. Ions in the plasma are drawn to the roller electrode 13 and implanted to the surface of the film 3 wound by the roller electrode 13.

In Embodiment 2, the flow straightening members 42 are formed of a material which allows the members to serve as an electrode. Thus, since the flow straightening members 42 disposed between the roller electrode 23 and the inner wall of the vacuum chamber 11 also work as electrodes, an electric field is provided between the roller electrode 13 and the flow straightening members 42. By virtue of 1 pmp, the thus-provided electric field has a field intensity higher than that of the electric field provided between the roller electrode 13 and the inner wall of the chamber, since the electric field intensity between two electrodes is in inverse proportion to the inter-electrode distance. Thus, in Embodiment 2, since the flow straightening members 42 also serve as electrodes, the electric field between the roller electrode 13 and the flow straightening members 42 is strengthened, to thereby enhance the density of the plasma generated between the two types of electrodes.

Particularly, since the flow straightening members 42 (long sides) are disposed over the width of the roller electrode 13 (the axial length), the distance between each flow straightening member 42 and the roller electrode 13 is constant along the axial direction. Thus, a uniform and intense electric field is provided along the axial direction of the roller electrode 13. As a result, a plasma can be generated such that the plasma density along the axial direction of the roller electrode 13 is enhanced and is uniform along the axial direction.

Also, since the flow straightening members 42 are disposed along the circumferential direction of the roller electrode 13, the distance between the flow straightening members 42 and the roller electrode 13 is constant along the circumferential direction. Thus, there is provided an electric field which is uniform and has high field intensity, along the circumferential of the roller electrode 13. As a result, a plasma can be generated such that the plasma density along the circumferential direction of the roller electrode 13 is enhanced and is uniform along the circumferential direction.

As described above, in the ion implantation apparatus 1 according to Embodiment 2, the gas discharge outlet 22 oppositely faces the gas introduction unit 35, whereby a uniform flow of the ion Implantation gas can. be attained in the vacuum chamber 11 along the axial direction of the roller electrode 13. Thus, a uniform plasma density can be attained.

Furthermore, through provision, of the flow straightening members 42 below the roller electrode 13, the flow of the ion implantation gas can be straightened, and a uniform plasma density can be attained. In addition, when the flow straightening members 42 serve as electrode members (grounds), an electric field having higher field intensity can be provided upon formation of a plasma. Thus, a plasma of interest can be formed without installing an additional voltage source.

Accordingly, the ion implantation apparatus of Embodiment 2 realizes more effective ion implantation treatment of interest.

Embodiment 3

An ion implantation apparatus according to Embodiment 3 of the invention differs from the ion implantation apparatus of Embodiment 2, in that the angle of each flow straightening member 42A with respect to the axial direction may be adjusted.

Figure 7:
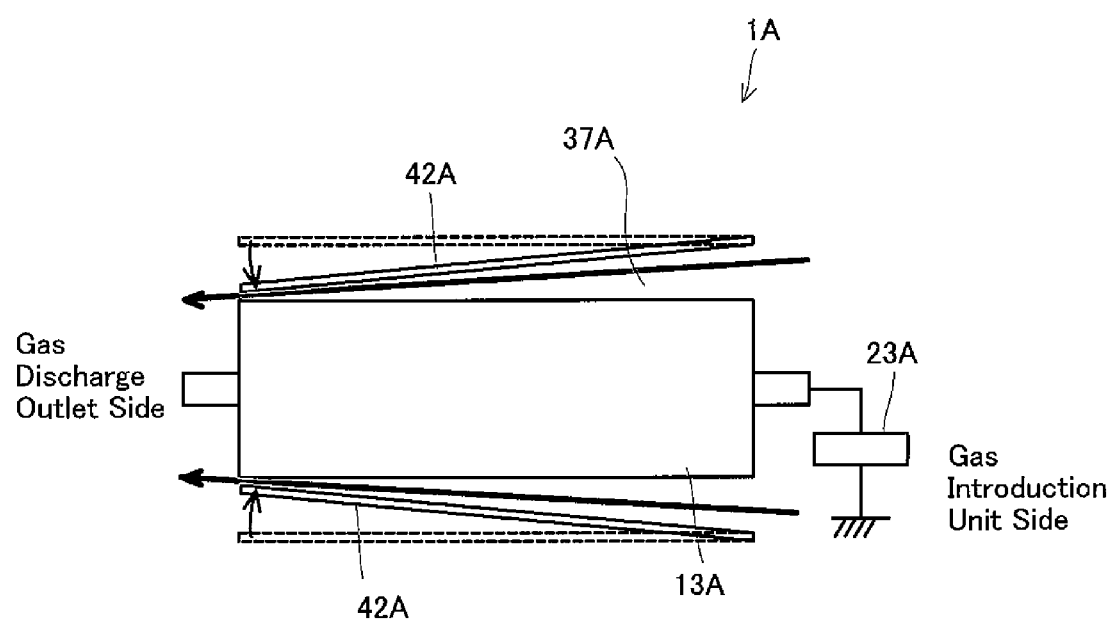
FIG. 7 A schematic view or a flow straightening device employed in the ion implantation apparatus according to Embodiment 3.

As shown in FIG. 7, in the ion implantation apparatus 1A of Embodiment 3, the disposition angle of each flow straightening member 42A is variable. Specifically, the volume of a space 37A defined between the flow straightening member 42A and the roller electrode 13A may be varied in the axial direction of the roller electrode 13A.

Thus, since the distance between each flow straightening member 42A and the roller electrode 13A can foe tuned, the straightening effect of the flow straightening member 42A can be enhanced. More specifically, preferably, the volume of the space 37A between the roller electrode 13A and a flow straightening member 42A gradually decreases from the gas introduction unit side to the gas discharge outlet side. In other word, the distance between the roller electrode 13A and the flow straightening member 42A on the gas introduction unit side is adjusted to be great, while the distance between the roller electrode 13A and the flow straightening member 42A on the gas discharge outlet side is adjusted to be small, whereby the ion implantation gas readily enter the space between the roller electrode 13A and the flow straightening member 42A, and the thus-entered gas is readily discharged through the gas discharge outlet 22A. In this case, the flow of the ion implantation gas in the vacuum chamber is straightened toward the gas introduction direction, whereby undesired diffusion and retention of the ion implantation gas can be prevented.

No particular limitation is imposed on the mode of regulating the volume of the space 37A between the flow straightening member 42A and the roller electrode. In one possible mode, the disposition angle of the flow straightening member 42A on the gas introduction unit side, and that on the gas discharge outlet side are modified.

In the case where the flow straightening members 42A are formed of a material which allows the members to servo as an electrode, the intensity of the electric field provided, between the roller electrode 13A and each flow straightening member 42A becomes uniform by the aforementioned effect and by such a structural feature that the volume of the space 31A between the roller electrode 13A and a flow straightening member 42A gradually decreases from the gas introduction unit side to the gas discharge outlet side.

The above feature will be described in more detail. To one end of the roller electrode 13A, a voltage is applied through the voltage application means 23A. The voltage applied to the roller electrode 13A drops, due to an intrinsic resistance of the roller electrode 13A, from the voltage application end to the other axial end of the roller electrode 13A. Doe to the drop in voltage, the intensity of the electric field provided between the roller electrode ISA and the flow straightening members 42A may conceivably decrease from the voltage application end to the other axial (longitudinal) end of the roller electrode 13A. If this drop occurs, the plasma density on the surface the film along the axial direction becomes non-uniform.

In order to solve the problem, in Embodiment 3, any of the angle of the flow straightening members 42A; i.e., the distance between the flow straightening member 42A and the roller electrode 13A, is modified, to thereby attain a uniform field intensity of the electric field provided along the axial direction of the roller electrode 13A.

Specifically, the distance between the voltage application end of the roller electrode 13A and the flow straightening member 42A is adjusted to the same value as employed in Embodiment 1, and the distance between the other axial end of the roller electrode 13A and the flow straightening member 42A is reduced. Through this configuration, the field intensity of the electric field roller provided along the axial direction of the roller electrode 13A can be adjusted to be uniform.

As described above, in the ion implantation apparatus 1A. according to Embodiment 3, the gas discharge outlet oppositely faces the gas introduction unit, whereby a uniform flow of the ion implantation gas can foe attained in the vacuum chamber 11 along the axial direction of the roller electrode 13A. Thus, a uniform plasma density can be attained.

Furthermore, through provision of the flow straightening members 42A below the roller electrode 13 in an angle variable manner, the flow of the ion implantation gas can be more effectively straightened, and a uniform plasma density can be attained. In addition, when the flow straightening members 42A serve as electrode members (grounds), an electric field having higher field intensity can be provided upon formation of a plasma. Thus, a plasma of interest can be formed without installing an additional voltage source.

DESCRIPTION OF REFERENCE NUMERALS 1, 1A . . . ion implantation apparatus
2 . . . gas discharge outlet
3 . . . film
11 . . . vacuum chamber
12 . . . side wall
13, 13A . . . roller electrode
14 . . . unwind roller
15 . . . conveying roller
16 . . . wind-up roller
21 . . . vacuum pump
22, 22A . . . gas discharge outlet
23, 23A . . . voltage application means
31 . . . gas source
32 . . . gas pipe
33 . . . control means
35 . . . gas introduction unit
36 . . . gas supply outlet
37, 37A . . . space
42, 42A . . . flow straightening member
43 . . . support member
44 . . . frame
45 . . . support base
46 . . . support member

The invention claimed is:

1. An ion implantation apparatus comprises:
a vacuum chamber,
a roller electrode having a portion of an outer circumferential part on which a film is wound,
voltage application means for applying a voltage to the roller electrode,
a gas introduction unit having a gas supply outlet for supplying an ion implantation gas into the vacuum chamber, and
a gas discharge outlet for discharging the gas present in the gas introduction unit and in the vacuum chamber,
wherein the gas introduction unit and the gas discharge outlet are disposed so as to be opposite each other along the axial direction of the roller electrode, the roller electrode intervening therebetween,
the gas introduction unit is disposed so as to be separated from the roller electrode and be opposite a peripheral portion of an axial end of the roller electrode, and
the gas supply outlets provided in the gas introduction unit are disposed so as to be opposite a peripheral portion of an axial end of the roller electrode.

2. The ion implantation apparatus according to claim 1, wherein the gas introduction unit is provided with a plurality of gas supply outlets.

3. The ion implantation apparatus according to claim 2, wherein the gas supply outlets are disposed so as to be separated from one another and be opposite a peripheral portion of an axial end of the roller electrode.

4. The ion implantation apparatus according to claim 3, which has a flow straightening member disposed between the roller electrode and the inner wall of the vacuum chamber, along the direction of gas flow from the gas supply outlets to the gas discharge outlet.

5. The ion implantation apparatus according to claim 2, which has a flow straightening member disposed between the roller electrode and the inner wall of the vacuum chamber, along the direction of gas flow from the gas supply outlets to the gas discharge outlet.

6. The ion implantation apparatus according to claim 1, which has a flow straightening member disposed between the roller electrode and the inner wall of the vacuum chamber, along the direction of gas flow from the gas supply outlets to the gas discharge outlet.

7. The ion implantation apparatus according to claim 6, wherein the flow straightening member is formed of a conductive metal.

8. The ion implantation apparatus according to claim 1, wherein the gas introduction unit has a circular cross-section similar to the generally circular cross-section of the roller electrode.

9. The ion implantation apparatus according to claim 1, wherein the gas introduction unit curves along the circumferential direction of the roller electrode.

* * * * *